(12) United States Patent
Kim

(10) Patent No.: US 9,875,170 B2
(45) Date of Patent: Jan. 23, 2018

(54) DATA STORAGE DEVICE FOR SELF-DETECTING ERROR AND LOGGING OPERATION AND METHOD OF OPERATING THE SAME

(71) Applicant: Samsung Electronics Co., Ltd., Suwon-si, Gyeonggi-do (KR)

(72) Inventor: Ji Hwan Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/956,846

(22) Filed: Dec. 2, 2015

(65) Prior Publication Data
US 2016/0162375 A1 Jun. 9, 2016

(30) Foreign Application Priority Data
Dec. 3, 2014 (KR) ........................ 10-2014-0172462

(51) Int. Cl.
| | |
|---|---|
| G06F 11/00 | (2006.01) |
| G06F 11/34 | (2006.01) |
| G06F 3/06 | (2006.01) |
| G06F 11/30 | (2006.01) |
| G06F 11/07 | (2006.01) |

(52) U.S. Cl.
CPC .......... *G06F 11/3466* (2013.01); *G06F 3/065* (2013.01); *G06F 3/0619* (2013.01); *G06F 3/0673* (2013.01); *G06F 11/07* (2013.01); *G06F 11/3037* (2013.01); *G06F 11/3476* (2013.01); *G06F 2201/86* (2013.01); *G06F 2201/88* (2013.01)

(58) Field of Classification Search
USPC .......................................................... 714/48
See application file for complete search history.

(56) References Cited

U.S. PATENT DOCUMENTS

| | | | |
|---|---|---|---|
| 7,239,547 B2 | 7/2007 | Suda | |
| 7,679,133 B2 | 3/2010 | Son et al. | |
| 8,051,337 B2 | 11/2011 | Chen | |
| (Continued) | | | |

FOREIGN PATENT DOCUMENTS

| | | |
|---|---|---|
| JP | 2001051868 A | 2/2001 |
| JP | 2002023968 A | 1/2002 |
| (Continued) | | |

*Primary Examiner* — Sarai Butler
(74) *Attorney, Agent, or Firm* — Harness, Dickey & Pierce, P.L.C.

(57) ABSTRACT

A method of operating a data storage device which is provided with an operating voltage from a host and communicates with the host is provided. The method includes converting an operation mode of the data storage device into a debugging mode in response to a log start command transmitted from the host, receiving a first operation command from the host and executing the first operation command, generating first log information corresponding to a result of executing the first operation command, storing the first log information in a first storage area of memory of the data storage device, and copying at least part of the first log information from the first storage area to a second storage area of the memory of the data storage device when an event occurs according to the result of executing the first operation command.

20 Claims, 11 Drawing Sheets

(56) References Cited

U.S. PATENT DOCUMENTS

| | | | |
|---|---|---|---|
| 8,327,066 B2 | 12/2012 | Heo et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,656,251 B2 | 2/2014 | Sarcone et al. | |
| 2002/0100023 A1* | 7/2002 | Ueki | G06F 11/3636 717/127 |
| 2004/0153710 A1* | 8/2004 | Fair | G06F 11/0727 714/4.1 |
| 2007/0005829 A1 | 1/2007 | Fujimoto | |
| 2010/0082890 A1* | 4/2010 | Heo | G06F 12/0246 711/103 |
| 2011/0233648 A1 | 9/2011 | Seol et al. | |
| 2013/0007353 A1* | 1/2013 | Shim | G11C 16/10 711/103 |
| 2013/0232386 A1 | 9/2013 | Shore | |
| 2016/0098216 A1* | 4/2016 | Huang | G06F 11/1072 714/37 |
| 2016/0147582 A1* | 5/2016 | Karakulak | G11C 16/3418 714/37 |

FOREIGN PATENT DOCUMENTS

| | | |
|---|---|---|
| JP | 2005071068 A | 3/2005 |
| JP | 2010079856 A | 4/2010 |
| JP | 2011154593 A | 8/2011 |

\* cited by examiner

FIG. 5

TABLE

| Reference Count / Page | READ COUNT | READ RECLAIM COUNT | P/E CYCLE | RESERVED BLOCK COUNT |
|---|---|---|---|---|
| PAGE1 | CN1-1 | CN2-1 | CN3-1 | CN4-1 |
| PAGE2 | CN1-2 | CN2-2 | CN3-2 | CN4-2 |
| ⋮ | ⋮ | ⋮ | ⋮ | ⋮ |
| PAGEn | CN1-n | CN2-n | CN3-n | CN4-n |

DATA STORAGE DEVICE FOR SELF-DETECTING ERROR AND LOGGING OPERATION AND METHOD OF OPERATING THE SAME

CROSS-REFERENCE TO RELATED APPLICATION

This application claims priority under 35 U.S.C. § 119(a) from Korean Patent Application No. 10-2014-0172462 filed on Dec. 3, 2014, the disclosure of which is incorporated herein by reference in its entirety.

BACKGROUND

At least some example embodiments of the inventive concepts relate to a data storage device, and more particularly, to a data storage device for self-detecting an error and logging an operation and a method of operating the same.

A memory device includes a plurality of memory cells that store data. It is desirable to minimize data errors in order to enable a system including a memory device to operate normally. There may be different causes of data errors occurring in memory cells. Failure analysis is a feedback process for tracing the cause of failure and providing improvements.

Since conventional failure analysis uses different host platforms, evaluation tools, and software, there are many different types of failures and a big variable.

SUMMARY

With respect to conventional failure analysis, in at least some instances, when there is an error in a memory device, evaluation is continued and a failure is not logged. As a result, analysis is protracted. Accordingly, it is desirable to exactly detect a type of failure that may occur in memory cells so that the cause of the failure can be efficiently analyzed.

According to at least some example embodiments of the inventive concepts, there is provided a method of operating a data storage device which is provided with an operating voltage from a host and communicates with the host. The method includes converting an operation mode of the data storage device into a debugging mode in response to a log start command transmitted from the host, receiving a first operation command from the host and executing the first operation command, generating first log information corresponding to a result of executing the first operation command, storing the first log information in a first storage area of memory of the data storage device, and copying at least part of the first log information from the first storage area to a second storage area of the memory of the data storage device when an event occurs according to the result of executing the first operation command.

The event may occur when an error is detected in data stored in the data storage device according to the first operation command, when a read count corresponding to the first operation command is equal to or greater than a reference read count, when a read reclaim count corresponding to the first operation command is equal to or greater than a reference read reclaim count, when the number of program/erase (P/E) cycles performed according to the first operation command is equal to or greater than a reference P/E cycle count, or when the number of reserved blocks updated according to the result of executing the first operation command in the data storage device is less than a reference reserved block count.

The method may further includes receiving a second operation command from the host after occurrence of the event, executing the second operation command, generating second log information corresponding to a result of executing the second operation command, storing the second log information in the first storage area of the memory of the data storage device, and storing at least part of the second log information in the second storage area of the memory of the data storage device. The first storage area and the second storage area may be different memory blocks. The first operation command may be a program command, a read command, or an erase command.

According to at least some example embodiments, a method of operating a data storage device includes receiving, at the data storage device, a log start command from a host; changing an operation mode of the data storage device from a first mode into a debugging mode, in response to the log start command; when the data storage device is in the debugging mode, receiving a first operation command from the host; executing the first operation command; generating first log information associated with the first operation command; storing the first log information in a first storage area; determining whether a first event corresponding to the first operation occurred; and copying at least part of the first log information from the first storage area to a second storage area in response to determining the first event occurred, if the determining determines the first event occurred, the first and second storage areas being storage areas of the data storage device.

The determining may determine the first event occurred when an error is detected in data stored in the data storage device according to the first operation command.

The determining may determine the first event occurred when a read count of the data storage device is equal to or greater than a reference read count.

The determining may determine the first event occurred when a read reclaim count of the data storage device is equal to or greater than a reference read reclaim count.

The determining may determine the first event occurred when a number of program/erase (P/E) cycles performed by the data storage device is equal to or greater than a reference P/E cycle count.

The determining may determine the first event occurred when a number of reserved blocks updated according to the result of executing the first operation command in the data storage device is less than a reference reserved block count.

According to at least some example embodiments, a method of operating a data storage system including a host and a data storage device includes receiving, at the data storage device, a log start command from the host; changing an operation mode of the data storage device from a first mode into a debugging mode, in response to the log start command; and when the data storage device is in the debugging mode, receiving a first operation command from the host, executing the first operation command, generating first log information associated with the first operation command, storing the first log information in a first storage area, determining whether a first event corresponding to the first operation occurred, and copying at least part of the first log information from the first storage area to a second storage area in response to determining the first event occurred, if the determining determines the first event occurred, the first and second storage areas being storage areas of the data storage device.

According to at least some other example embodiments of the inventive concepts, there is provided a data storage device which is provided with an operating voltage from a host and communicates with the host. The data storage device includes a memory including a first storage area and a second storage area; and a memory controller configured to control an operation of the memory. The memory controller may convert an operation mode of the data storage device from a normal mode into a debugging mode in response to a log start command transmitted from the host, execute a first operation command received from the host, generate first log information corresponding to a result of executing the first operation command, store the first log information in the first storage area, and copy at least part of the first log information from the first storage area to the second storage area when an event occurs according to the result of executing the first operation command.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 5 is a diagram of a table that stores reference counts according to at least some example embodiments of the inventive concepts;

DETAILED DESCRIPTION OF THE EMBODIMENTS

Figure 1:
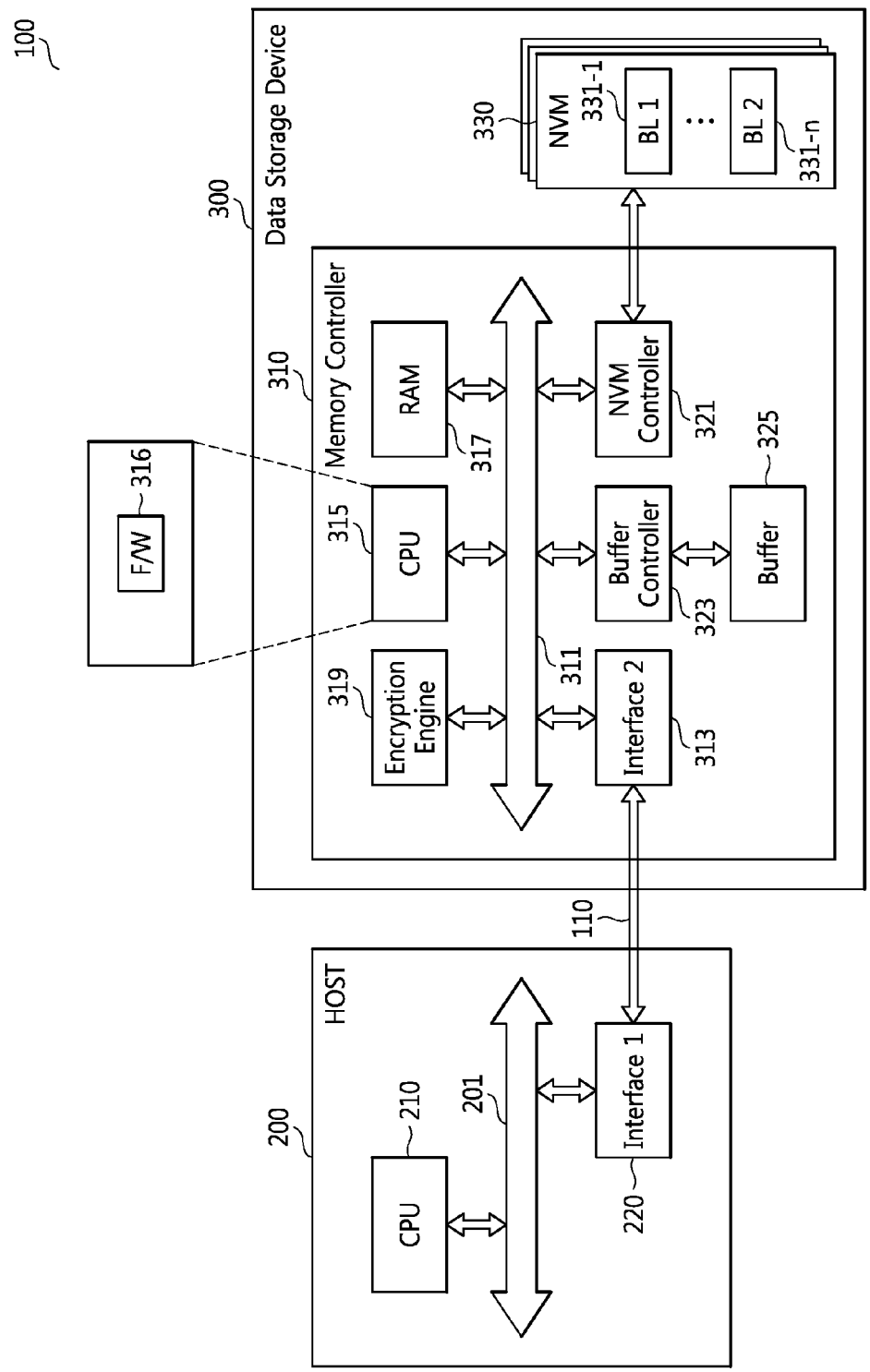
FIG. 1 is a schematic block diagram of a data processing system according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a schematic block diagram of a data processing system 100 according to at least some example embodiments of the inventive concepts. The data processing system 100 may include a host 200 and a data storage device 300, which are connected to each other via an interface 110. The data processing system 100 may be implemented as a server computer, a personal computer (PC), a desktop computer, a laptop computer, a workstation computer, a network-attached storage (NAS), a data center, an internet data center (IDC), or a mobile computing device. The mobile computing device may be implemented as a smart phone, a tablet PC, a wearable device, or a mobile internet device (MID).

The host 200 may provide operating voltages for the data storage device 300. The host 200 may also transmit a log start command and operation commands to the data storage device 300 via the interface 110. The log start command may be used to convert the mode of operation of the data storage device 300 from normal mode to debugging mode. The operation commands may be used to perform a test on the data storage device 300.

The host 200 may control a data processing operation (e.g., a program operation, an erase operation, or a read operation) of the data storage device 300. The host 200 may include a processor. For example, the host 200 may include a central processing unit (CPU) 210 and a first interface 220. The block diagram of the host 200 illustrated in FIG. 1 is just an example and at least some example embodiments of the inventive concepts are not restricted to this block diagram. The host 200 may also include other components (e.g., a display controller and a display) besides the first interface 220.

The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multiprocessor, an application-specific integrated circuit (ASIC), and a field programmable gate array (FPGA).

The host 200 may be implemented as an integrated circuit (IC), a mother board, or a system on chip (SoC), but at least some example embodiments of the inventive concepts are not restricted to these examples. Alternatively, the host 200 may be implemented as an application processor (AP) or a mobile AP.

The CPU 210 may communicate a command and/or data with the first interface 220 via bus architecture 201. The bus architecture 201 may be advanced microcontroller bus architecture (AMBA), advanced extensible interface (AXI), an advanced peripheral bus (APB), or an advanced high-performance bus (AHB) but is not restricted thereto.

The CPU 210 may transmit a log start command to convert the mode of operation of the data storage device 300 from normal mode to debugging mode and operation commands to perform a test on the data storage device 300. The CPU 210 may be a processor which can execute a program or programs for carrying out operations according to at least some example embodiments of the inventive concepts.

The first interface 220 may be connected with a second interface 313 of the data storage device 300 via the interface 110. The interfaces 110, 220, and 313 may support a peripheral component interconnect-express (PCIe) protocol, a serial advanced technology attachment (SATA) protocol, a SATA express (SATAe) protocol, a serial attached SCSI (small computer system interface) (SAS) protocol, or a non-volatile memory express (NVMe) protocol, but at least some example embodiments of the inventive concepts are not restricted to these examples.

The data storage device 300 may include a memory controller 310, which may be a circuit or processor, and a non-volatile memory (NVM) 330. The data storage device 300 may be implemented as a flash-based memory device such as a solid state drive or solid state disk (SSD), an embedded SSD (eSSD), a universal flash storage (UFS), a multimedia card (MMC), or an embedded MMC (eMMC), but at least some example embodiments of the inventive concepts are not restricted to these examples. Alternatively, the data storage device 300 may be implemented as a hard disk drive (HDD). The data storage device 300 may be attached to or removed from the host 200. The data storage device 300 may be formed as a memory module.

The data storage device 300 may include a register (REG in FIG. 2) which may set or change the mode of operation of the data storage device 300 in response to a log start command received from the host 200. The register may be formed with static random access memory (SRAM) or special function register (SFR).

The data storage device 300 may be set to a debugging mode according to a value set in the register. When the data storage device 300 is set to the debugging mode, the data storage device 300 may receive each of operation commands to test the data storage device 300 from the host 200, may carry out each operation command, may generate log information corresponding to the result of carrying out the operation command, and may store the log information in the NVM 330.

The memory controller 310 may control transfer of a command and/or data between the host 200 and the NVM 330. The memory controller 310 may include the second interface 313, a processor (e.g., CPU 315), a RAM 317, an NVM controller 321, a buffer controller 323, a buffer 325, and an encryption engine 319. The NVM controller 321 and buffer controller 323 may each be, for examples, circuits.

The second interface 313 may be connected with the first interface 220 of the host 200 via the interface 110. The CPU 315 may control the second interface 313, the RAM 317, the NVM controller 321, the buffer controller 323, the buffer 325, and the encryption engine 319 via bus architecture 311. The CPU 315 may be a processor which can execute a program or programs for carrying out operations according to at least some example embodiments of the inventive concepts. The program(s) may execute instructions to allow the data storage device 300 to self-detect an error and to store a log corresponding to the detection result.

The second interface 313, the RAM 317, the NVM controller 321, the buffer controller 323, the buffer 325, and the encryption engine 319 may communicate a command and/or data with one another via the bus architecture 311. The bus architecture 311 may be data bus having an architecture corresponding to, for example, AMBA, AXI, APB, or AHB but is not restricted thereto.

The RAM 317 may store data, e.g., data about an error (or positions of memory cells causing the error) occurring in a data processing operation (e.g., a program operation, a read operation, or an erase operation) on the NVM 330, and/or count information corresponding to the data processing operation according to the control of a program executed by the CPU 315. The RAM 317 may be implemented as SRAM, cache, or tightly coupled memory (TCM), but at least some example embodiments of the inventive concepts are not restricted to these examples. Although the RAM 317 is provided outside the CPU 315 in the embodiments illustrated in FIG. 1, at least some example embodiments of the inventive concepts are not restricted to the current embodiments. The RAM 317 may be provided inside the CPU 315 in other embodiments.

The NVM controller 321 may perform a data processing operation corresponding to each of operation commands, may generate log information every time the data processing operation is completed, and may store the log information in the NVM 330 according to the control of the CPU 315. The NVM 330 may be formed with flash-based memory, but at least some example embodiments of the inventive concepts are not restricted to this example. The flash-based memory may be NAND-type flash memory or NOR-type flash memory. The flash-based memory may include a plurality of memory cells and an access control circuit which controls an access operation (such as a program operation or a read operation) on the memory cells. The memory cells may store information of at least one bit.

In at least one example embodiment of the inventive concepts, the flash-based memory may include a three dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In at least one example embodiment of the inventive concepts, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Alternatively, the NVM 330 may be formed with electrically erasable programmable read-only memory (EEPROM), magnetic RAM (MRAM), spin-transfer torque MRAM, ferroelectric RAM (FRAM), phase-change RAM (PRAM), resistive RAM (RRAM), nanotube RRAM, polymer RAM (PoRAM), nano floating gate memory (NFGM), holographic memory, molecular electronics memory device, or insulator resistance change memory.

The NVM controller 321 may store log information in a first storage area 331-1 of the NVM 330. When an event occurs, the NVM controller 321 may record or copy at least part of the log information to a second storage area 331-$n$ of the NVM 330. Occurrence or non-occurrence of the event may be determined depending on a result of executing an operation command.

Figure 2:
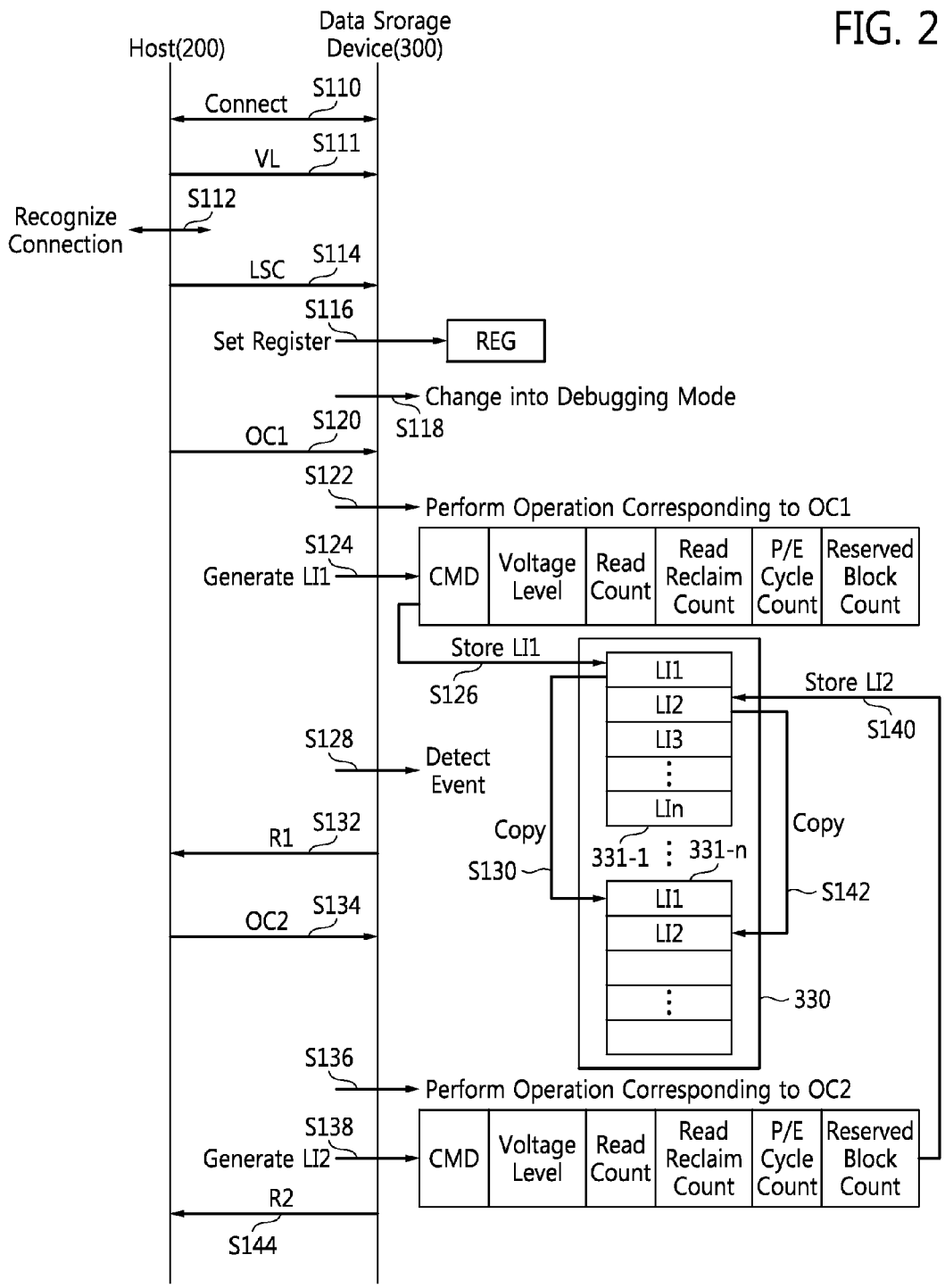
FIG. 2 is a conceptual diagram of an operation of the data processing system illustrated in FIG. 1 according to at least some example embodiments of the inventive concepts.
Figure 3:
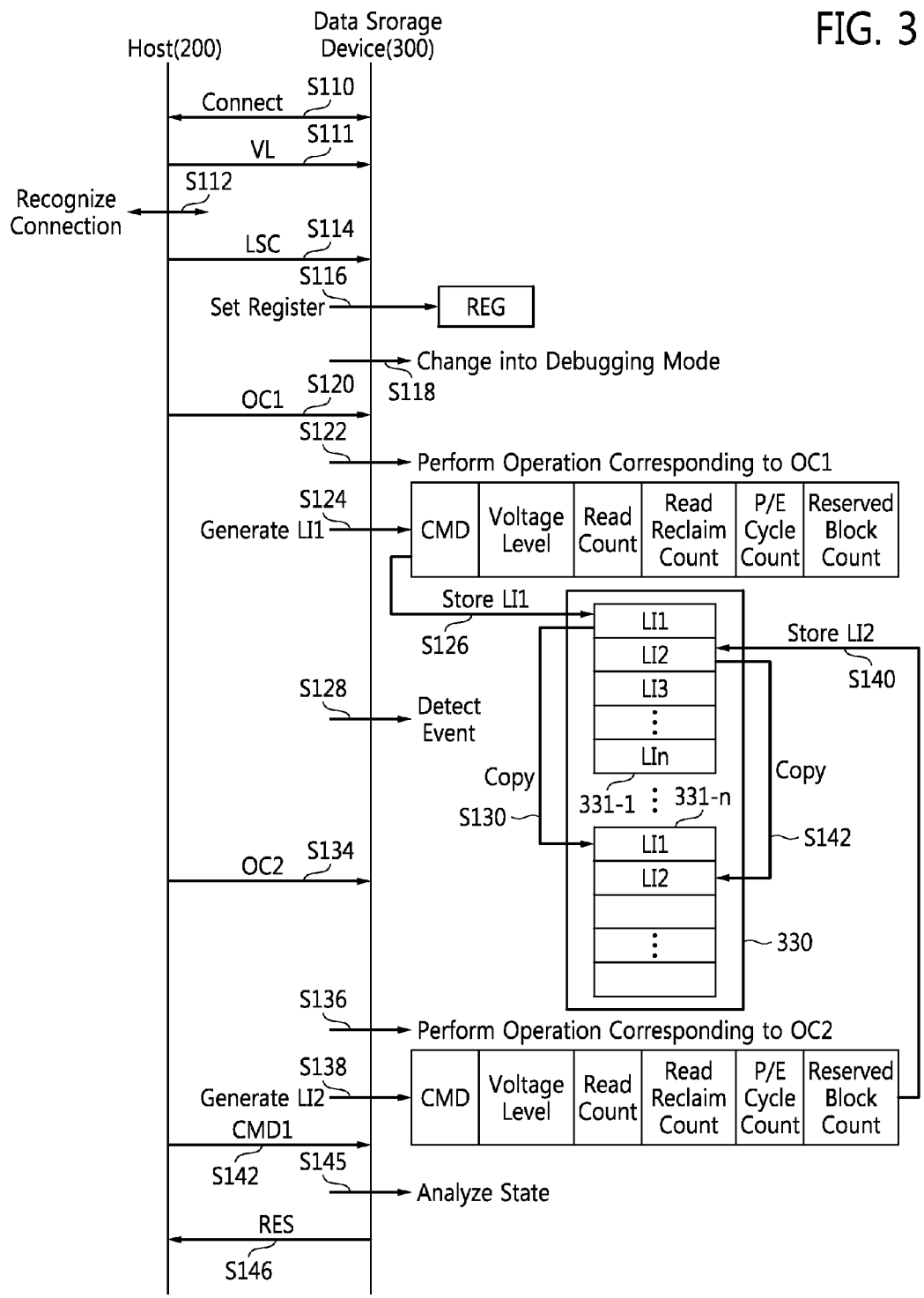
FIG. 3 is a conceptual diagram of an operation of the data processing system illustrated in FIG. 1 according to at least some other example embodiments of the inventive concepts.

FIG. 2 is a conceptual diagram of an operation of the data processing system 100 illustrated in FIG. 1 according to at least some example embodiments of the inventive concepts. FIG. 3 is a conceptual diagram of an operation of the data processing system 100 illustrated in FIG. 1 according to at least some other example embodiments of the inventive concepts, and will be discussed in greater detail below.

Referring to FIGS. 1 and 2, when the data storage device 300 is connected to the host 200 in operation S110, the data storage device 300 is provided with an operating voltage VL from the host 200 in operation S111. The host 200 may recognize the connection of the data storage device 300 in operation S112. Order of operations S110, S111, and S112 may be variously changed according to embodiments.

Before a test is performed on the data storage device 300, the CPU 210 of the host 200 may generate a log start command LSC and may transmit the log start command LSC to the data storage device 300 in operation S114. The CPU 315 may set the register REG, which sets the mode of operation of the data storage device 300, to a predetermined or, alternatively, desired bit in response to the log start command LSC in operation S116. The register REG may be implemented in any place in the memory controller 310.

The data storage device 300 may be set or converted to a debugging mode according to the bit set in the register REG in operation S118. The bit may include at least one data value. After the data storage device 300 is set to the debugging mode, the host 200 or the CPU 210 may generate a first operation command OC1 to test the data storage device 300.

The data storage device 300 may receive the first operation command OC1 from the host 200 in operation S120 and perform a data processing operation (e.g., a program operation, a read operation, or an erase operation) corresponding to the first operation command OC1 in operation S122. The first operation command OC1 may be a program command, a read command, or an erase command but is not restricted thereto.

Figure 4:
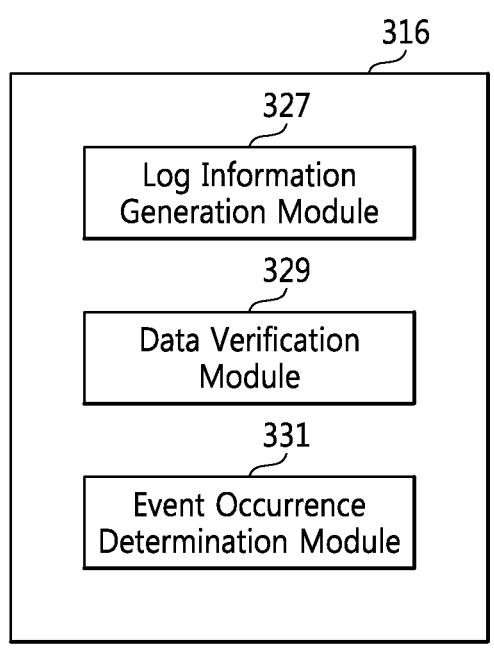
FIG. 4 is a detailed block diagram of firmware executed in a central processing unit (CPU) illustrated in FIG. 1.

FIG. 4 is a detailed block diagram of firmware 316 executed in the CPU 315 illustrated in FIG. 1. Referring to FIGS. 1, 2, and 4, the firmware 316 may include a log information generation module 327, a data verification module 329, and an event occurrence determination module 331. Here, a module may refer to a computer program code for performing a function and operation corresponding to its title. In other words, a module may refer to a functional and/or structural combination of software for implementing at least some example embodiments of the inventive concepts. Each of the modules 327, 329, and 331 illustrated in FIG. 4 may refer to a computer program code or an instruction. According to at least one example embodiment of the inventive concepts, operations described herein as being performed by any of the modules 327, 329, and 331 may be performed by one or more processors (e.g., the CPU 315) executing instructions corresponding to the described operations.

The log information generation module 327 may generate first log information LI1 corresponding to the result of the data processing operation performed in the data storage device 300 in operation S124. The first log information LI1 may be stored in the first storage area 331-1 of the NVM 330 in operation S126. The log information generation module 327 may measure a read count, a read reclaim count, the number of program/erase (P/E) cycles, and/or a reserved block count for each of the pages of the NVM 330 and may generate the first log information LI1 using count information corresponding to the measurement result. The first log information LI1 may include one or more attributes of the storage data device, examples of which include a command CMD corresponding to the first operation command OC1, a voltage level corresponding to the operating voltage VL, the read count, the read reclaim count, the number of P/E cycles, and the reserved block count. The one or more attributes included in the first log information LI1 may be attributes associated with, or resulting from, the first operation command OC1 (e.g., attributes of the data storage device 300 around the time of the execution of the $1^{st}$ operation command OC1).

Similarly, $x^{th}$ log information LIx (x being a positive integer) may include one or more attributes of the storage data device, examples of which include a command CMD corresponding to an $x^{th}$ operation command OCx, a voltage level corresponding to the operating voltage VL, the read count, the read reclaim count, the number of P/E cycles, and the reserved block count. The one or more attributes included in the $x^{th}$ log information LIx may be attributes associated with, or resulting from, the $x^{th}$ operation command OC1 (e.g., attributes of the data storage device 300 around the time of the execution of the $x^{th}$ operation command OCx).

The data verification module 329 may determine whether data stored in memory cells of the NVM 330 have been corrupt when a data processing operation corresponding to the first operation command OC1 received from the host 200 is a program operation. Whether the data have been corrupt or not may be determined by performing error checking on data after being programmed to memory cells of the NVM 330 based on data before being programmed to memory cells of the NVM 330. Cyclic redundancy check (CRC) may be used for the error checking, but at least some example embodiments of the inventive concepts are not restricted to this example.

In detail, the buffer controller 323 may store first data, which corresponds to the data before being programmed to the memory cells of the NVM 330, in the buffer 325. The NVM controller 321 may read second data, which corresponds to the data after being programmed, from the NVM 330 and transmit the second data to the buffer controller 323. The buffer controller 323 may perform CRC on the second data based on the first data stored in the buffer 325 to check whether an error has occurred in the second data.

The event occurrence determination module 331 may determine whether an event has occurred or not in the data storage device 300 according to the result of performing the data processing operation corresponding to the first operation command OC1 in operation S128. The NVM 330 may include a memory area which stores a reference count for a data processing operation. At this time, reference counts corresponding to respective pages of the NVM 330 may be stored in the memory area in a table format.

FIG. 5 is a diagram of a table that stores reference counts according to at least some example embodiments of the inventive concepts. Referring to FIG. 5, a reference count for each of pages PAGE1 through PAGEn (where "n" is a natural number of at least 2) may include at least one among a read count, a read reclaim count, the number of P/E cycles, and a reserved block count which are referred to for a data processing operation of each page.

When the read count and the read reclaim count increase in the data storage device 300, the reliability of data decreases. Accordingly, an event may occur when the read count for each page corresponding to the first operation command OC1 is equal to or greater than corresponding one of reference read counts CN1-1 through CN1-n or when the read reclaim count for each page corresponding to the first operation command OC1 is equal to or greater than a corresponding one of reference read reclaim counts CN2-1 through CN2-n.

In addition, when the number of P/E cycles increases, the reliability of data stored in the NVM 330 decreases. Accordingly, an event may occur when the number of P/E cycles performed according to the first operation command OC1 is equal to or greater than a corresponding one of reference P/E cycle counts CN3-1 through CN3-n.

A reserved block may refer to a block reserved in the NVM 330 for a bad block. The expected life time of the data storage device 300 can be estimated from the number of reserved blocks, and therefore, an event may occur when the number of reserved blocks, i.e., the reserved block count in the data storage device 300 is less than reference reserved block count CN4-1 through CN4-n.

In other embodiments, the event occurrence determination module 331 may determine that an event has occurred when the data verification module 329 determines that an error has occurred in data stored in memory cells of the NVM 330.

As shown in FIG. 5, a reference count may be provided for each of the pages PAGE1 through PAGEn of the NVM 330. However, at least some example embodiments of the inventive concepts are not restricted to the current embodiments. For instance, a P/E cycle count may be managed by blocks.

Referring back to FIGS. 1 and 2, when it is determined that an event has occurred according to the result of executing the first operation command OC1 in operation S128, the NVM controller 321 may copy the first log information LI1 from the first storage area 331-1 to the second storage area 331-n in operation S130. Alternatively, before copying the first log information LI1 from the first storage area 331-1 to the second storage area 331-n, the NVM controller 321 may transmit the first log information LI1 to the encryption engine 319 first. An encryption key may be used during encryption by the encryption engine 319. The encryption engine 319 may include a storage medium (not shown) to store the encryption key and may access the storage medium. The encryption engine 319 may encrypt the first log information LI1 using the encryption key and may transmit encrypted first log information to the NVM controller 321. The NVM controller 321 may store the encrypted first log information in the second storage area 331-n.

The data storage device 300 may transmit a first response R1 to the host 200 in response to the first operation command OC1 received from the host 200 in operation S132. The first response R1 may include information indicating whether an event has occurred, for example, whether failure has been detected in the data storage device 300 according to the result of the first operation command OC1 executed in the data storage device 300.

The data storage device 300 may receive a second operation command OC2 from the host 200 in operation S134 and may perform a data processing operation corresponding to the second operation command OC2.

The data storage device 300 may generate second log information LI2 corresponding to the result of performing the data processing operation according to the second operation command OC2 in operation S138 and may store the second log information LI2 in the first storage area 331-1 of the NVM 330 in operation S140. When an event occurs according to the result of executing the second operation command OC2, the data storage device 300 may copy the second log information LI2 from the first storage area 331-1 to the second storage area 331-$n$ in operation S142.

Alternatively, before copying the second log information LI2 from the first storage area 331-1 to the second storage area 331-$n$, the NVM controller 321 may transmit the second log information LI2 to the encryption engine 319 first. The encryption engine 319 may encrypt the second log information LI2 using the encryption key and may transmit encrypted second log information to the NVM controller 321. The NVM controller 321 may store the encrypted second log information in the second storage area 331-$n$ The data storage device 300 may transmit a second response R2 to the host 200 in response to the second operation command OC2 received from the host 200 in operation S144. The second response R2 may include information indicating whether an event has occurred, that is, whether failure has been detected in the data storage device 300 according to the result of the second operation command OC2 executed in the data storage device 300.

FIG. 3 is a conceptual diagram of an operation of the data processing system 100 illustrated in FIG. 1 according to at least some other example embodiments of the inventive concepts. The operation illustrated in FIG. 3 is substantially the same as or similar to that illustrated in FIG. 2 with the exceptions that the host 200 transmits a command CMD1 to the data storage device 300 in operation S142, the data storage device 300 analyzes a state of the data storage device 300 in response to the command CMD1 in operation S146, and the responses R1 and R2 are not transmitted to the host 200 in operation S132 and S144. Thus, detailed descriptions of the operation illustrated in FIG. 3 will be omitted.

The command CMD1 may be a log end command. In response to the command CMD1, the data storage device 300 may terminate the debugging mode, may analyze its state in operation S145, and may transmit a response RES corresponding to the analysis result to the host 200 in operation S146.

Figure 6:
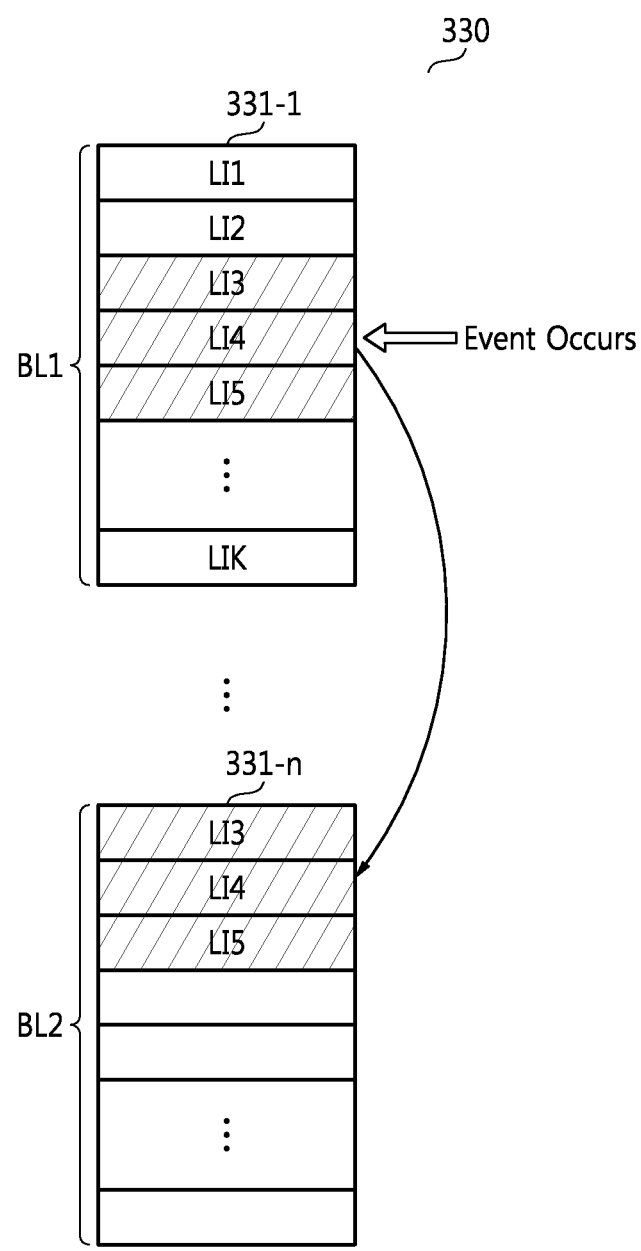
FIG. 6 is a conceptual diagram of an operation performed in a data storage device illustrated in FIG. 2.

FIG. 6 is a conceptual diagram of an operation performed in the data storage device 300 illustrated in FIG. 2. Referring to FIGS. 1, 2, and 6, the data storage device 300 may perform a data processing operation corresponding to an operation command received from the host 200 and may store log information LI1, LI2, . . . , or LIK (where "K" is a natural number of at least 2) in the first storage area 331-1 whenever the data processing operation is completed.

When an event occurs according to a result of executing an operation command involving the generation of the log information LI4, the NVM controller 321 may copy at least part of log information (e.g., the third log information LI3) stored in the first storage area 331-1 before the event occurs and the fourth log information LI4 to the second storage area 331-$n$ in operation S130 or S142. In addition to, or as an alternative to, copying at least a part of log information stored in the first storage area 331-1 before the event occurs, the NVM controller 321 may copy at least part of log information (e.g., the fifth log information LI5) stored in the first storage area 331-1 after the event occurs to the second storage area 331-$n$ in operation S130 or S142.

According to at least some example embodiments of the inventive concepts, the second storage area 331-$n$ may store information generated by the internal operation of the data storage device 300 and may not be programmed or erased by the command of the host 200, but at least some example embodiments of the inventive concepts are not restricted to the current embodiments. The data storage device 300 stores information generated before and after an event occurs in a predetermined or, alternatively, desired area in the NVM 330, so that the host 200 or the data storage device 300 is able to efficiently manage failure analysis.

Figure 7:
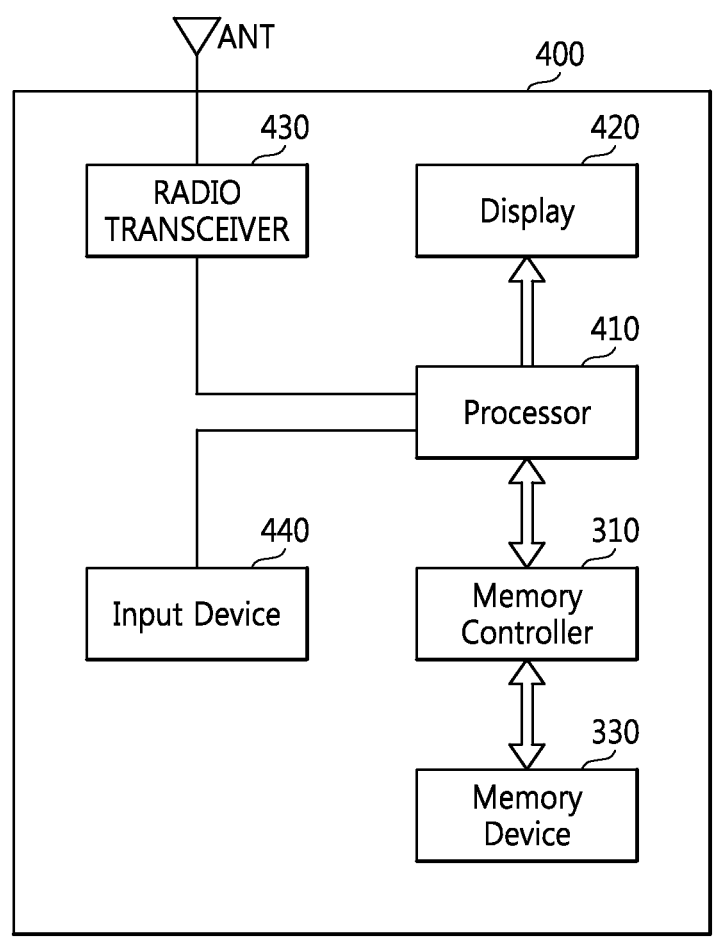
FIG. 7 is a diagram of an electronic device including the data storage device illustrated in FIG. 1 according to at least some example embodiments of the inventive concepts.

FIG. 7 is a diagram of an electronic device 400 including the data storage device 300 illustrated in FIG. 1 according to at least some example embodiments of the inventive concepts. According to at least some example embodiments, the electronic device 400 may be a data storage system. Referring to FIGS. 1 and 7, the electronic device or data storage system 400 may be implemented as a cellular or mobile phone, a smart phone, a tablet PC, a personal digital assistant (PDA), a video game console, or a handheld communication device.

The electronic device or data storage system 400 may include the memory controller 310 and the memory device 330. The memory device 330 may be implemented as the NVM 330. The memory controller 310 may control a data processing operation, e.g., a program (or write) operation, an erase operation, or a read operation, of the NVM 330 according to the control of a processor (or host) 410.

Data programmed to the NVM 330 may be displayed through a display 420 according to the control of the processor 410 and/or the memory controller 310. The display 420 may be implemented as a flat panel display such as a thin film transistor-liquid crystal display (TFT-LCD), a light emitting diode (LED) display, an organic LED (OLED) display, or an active matrix OLED (AMOLED) display.

A radio transceiver 430 may transmit or receive radio signals through an antenna ANT. The radio transceiver 430 may convert radio signals received through the antenna ANT into signals that can be processed by the processor 410. The processor 410 may process the signals output from the radio transceiver 430 and transmit the processed signals to the memory controller 310 or the display 420. The memory controller 310 may program the signals processed by the processor 410 to the NVM 330. The radio transceiver 430 may also convert signals output from the processor 410 into radio signals and output the radio signals to an external device through the antenna ANT.

An input device 140 enables control signals for controlling the operation of the processor 40 or data to be processed by the processor 40 to be input to the electronic device 400. The input device 440 may be implemented as, for example, a pointing device such as a touch pad or a computer mouse, a keypad, or a keyboard.

The processor 410 may control the operation of the display 420 to display data output from the memory controller 310, data output from the radio transceiver 430, or data output from the input device 440. The memory controller 310, which controls the operations of the NVM 330, may be implemented as a part of the processor 410 or as a separate chip. At this time, the processor 410 may be implemented as an AP.

Figure 8:
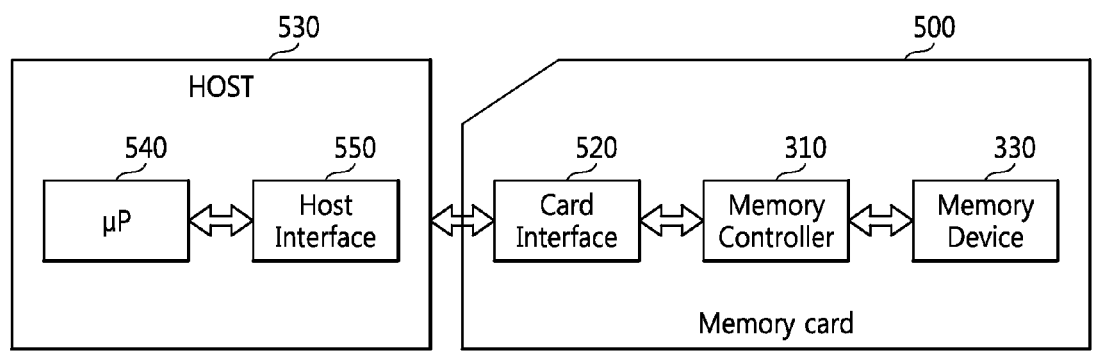
FIG. 8 is a diagram of an electronic device including the data storage device illustrated in FIG. 1 according to at least some other example embodiments of the inventive concepts.

FIG. 8 is a diagram of an electronic device 500 including the data storage device 300 illustrated in FIG. 1 according to at least some other example embodiments of the inventive concepts. For convenience' sake in the description, a host 530 is illustrated together with the electronic device 500. According to at least some example embodiments, the electronic device 500 may be a data storage system. The electronic device or data storage system 500 may be implemented as a memory card or a smart card. The memory card used to store digital information may be a PC card, an MMC, an eMMC, a secure digital (SD) card, or a universal serial bus (USB) flash drive.

The electronic device 500 like a memory card may include the memory controller 310, the memory device 330, and a card interface 520. The memory device 330 may be implemented as the NVM 330. The memory controller 310 may control data exchange between the NVM 330 and the card interface 520.

The card interface 520 may be an SD card interface, an MMC interface, or an eMMC interface, but at least some example embodiments of the inventive concepts are not restricted to the current embodiments. The card interface 520 may interface the host 530 and the memory controller 310 for data exchange according to a protocol of the host 530. The card interface 520 may support a USB protocol and an interchip (IC)-USB protocol, but at least some example embodiments of the inventive concepts are not restricted to the current embodiments. Here, the card interface 520 may refer to hardware supporting a protocol used by the host 530, software installed in the hardware, or a signal transmission mode.

When the electronic device 500 is connected with a host interface 550 of the host 530, the host interface 550 may perform data communication with the NVM 330 through the card interface 520 and the memory controller 310 according to the control of a microprocessor 540. The host 530 may be a PC, a laptop computer, a tablet PC, a digital camera, a digital audio player, a mobile or cellular phone, a video game console, an MP3 player, a portable multimedia player (PMP), an e-book, or a digital set-top box.

Figure 9:
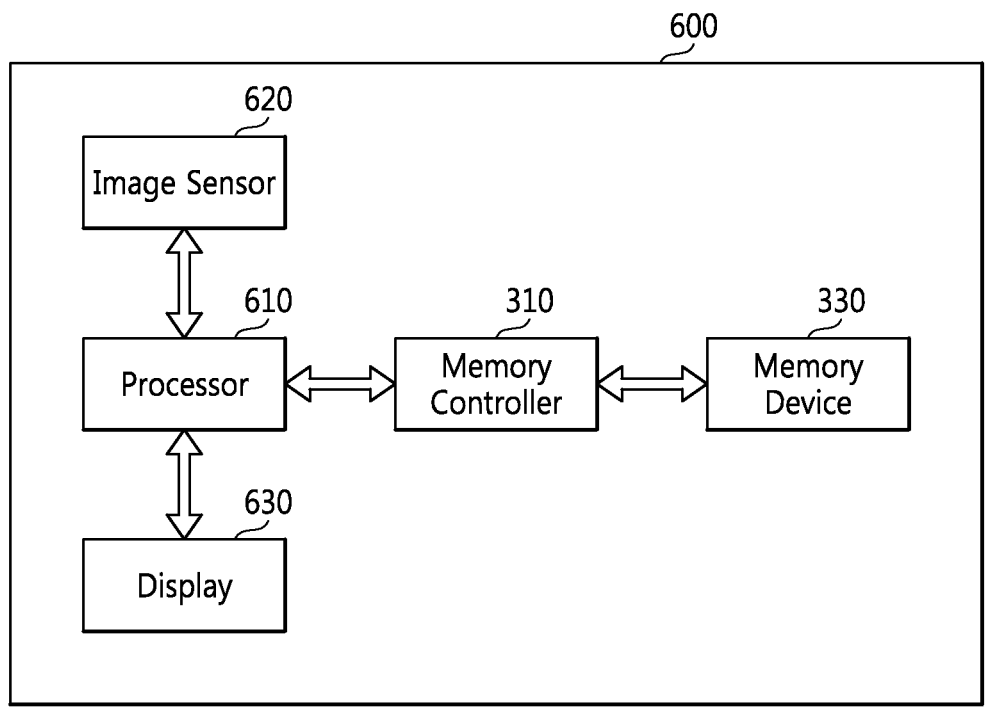
FIG. 9 is a diagram of an electronic device including the data storage device illustrated in FIG. 1 according to still at least some other example embodiments of the inventive concepts.

FIG. 9 is a diagram of an electronic device 600 including the data storage device 300 illustrated in FIG. 1 according to still at least some other example embodiments of the inventive concepts. According to at least some example embodiments, the electronic device 600 may be a data storage system. The electronic device or data storage system 600 may be implemented as an image processor like a digital camera, a cellular phone equipped with a digital camera, a smart phone equipped with a digital camera, or a tablet PC equipped with a digital camera.

The electronic device or data storage system 600 may include the memory device 330 and the memory controller 310 controlling a data processing operation, such as a program (or write) operation, an erase operation, or a read operation, of the memory device 330. The memory device 330 may be implemented as the NVM 330. An image sensor 620 included in the electronic device 600 converts optical images into digital image signals and outputs the digital image signals to a processor (or host) 610 and/or the memory controller 310. According to the control of the processor 610, the digital image signals may be displayed through a display 630 or stored in the NVM 330 through the memory controller 310.

Data stored in the NVM 330 is displayed through the display 630 according to the control of the processor 610 and/or the memory controller 310. The memory controller 310, which may control the operations of the NVM 330, may be implemented as a part of the processor 610 or as a separate chip.

Figure 10:
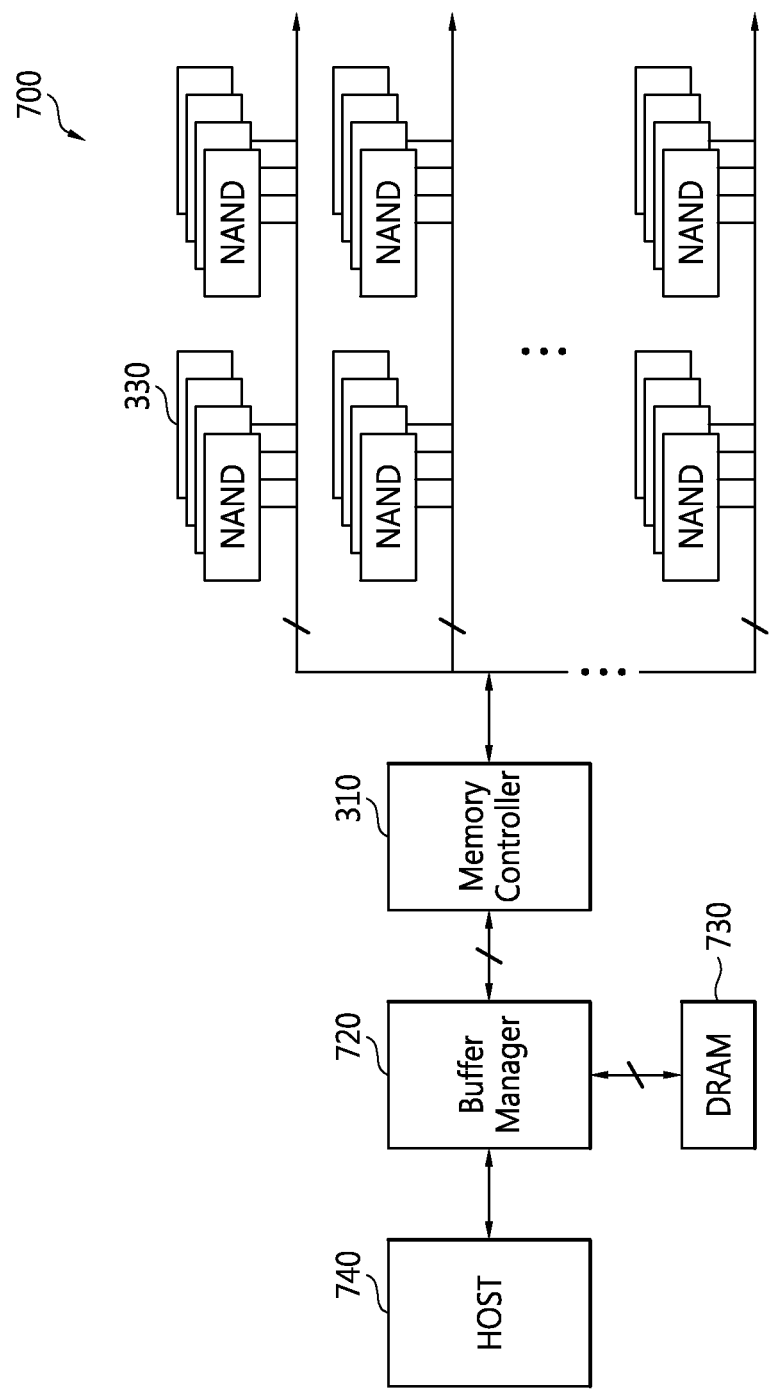
FIG. 10 is a diagram of an electronic device including the data storage device illustrated in FIG. 1 according to at least some further example embodiments of the inventive concepts.

FIG. 10 is a diagram of an electronic device 700 including the data storage device 300 illustrated in FIG. 1 according to at least some further example embodiments of the inventive concepts. According to at least some example embodiments, the electronic device 700 may be a data storage system. The electronic device or data storage system 700 may be implemented as a data storage system like an SSD. The electronic device 700 includes a plurality of NVMs 330, the memory controller 310, a volatile memory 730, and a buffer manager 720.

The memory controller 310 may control a data processing operation of the NVMs 330. Each of the NVMs 330 may be the one illustrated in FIG. 1, e.g., a NAND flash memory, and may include blocks. The memory controller 310 may program data to at least one page among the NVMs 330.

The volatile memory 730 may be implemented as dynamic random access memory (DRAM) and may function as a buffer that temporarily stores data transferred between the memory controller 310 and a host 740. The buffer manager 720 may control buffering of data transferred among the host 749, the volatile memory 730, and/or the memory controller 310.

Figure 11:
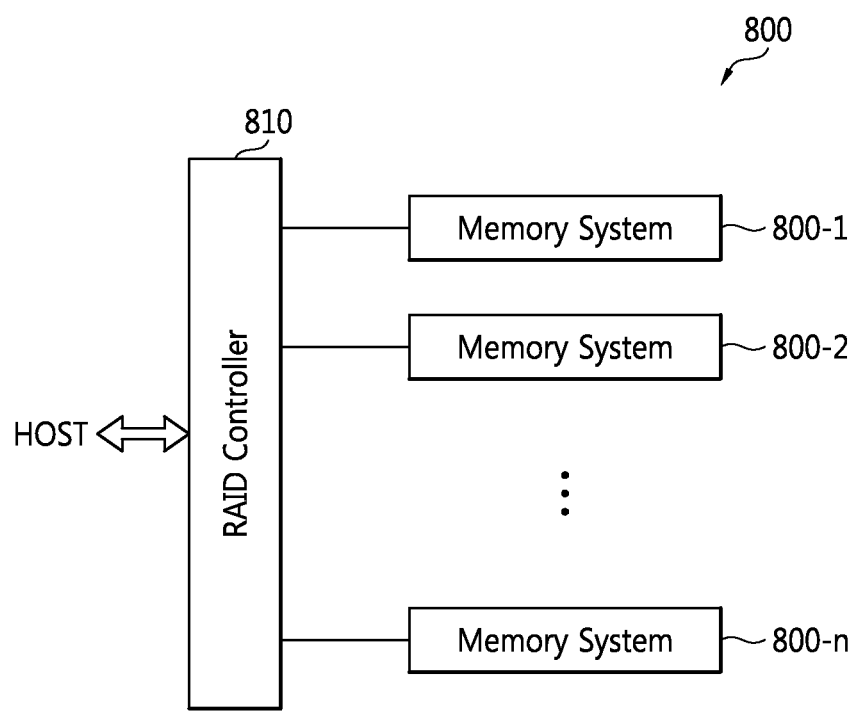
FIG. 11 is a block diagram of a data processing system including the electronic device illustrated in FIG. 10.

FIG. 11 is a block diagram of a data processing system 800 including the electronic device 700 illustrated in FIG. 10. According to at least some example embodiments, the data processing system 800 may be a data storage system. Referring to FIGS. 10 and 11, the data processing system or data storage system 800 may be implemented as a redundant array of independent disks (RAID) system. The data processing system 800 may include a RAID controller 810 and a plurality of electronic devices 800-1 through 800-n where "n" is a natural number.

Each of the electronic devices 800-1 through 800-n may be the electronic device 700 illustrated in FIG. 10. The electronic devices 800-1 through 800-n may form a RAID array. The data processing system 800 may be implemented as a PC, a NAS, or an SSD. Each of the electronic devices 800-1 through 800-n may be may be a memory system formed as a memory module.

During a program (or write) operation, the RAID controller 810 may transmit data output from a host to at least one of the electronic devices 800-1 through 800-n based on a RAID level at the program request (or write request) of the host. During a read operation, the RAID controller 810 may transmit to the host data read from at least one of the electronic devices 800-1 through 800-n in response to a read command received from the host.

As described above, according to at least some example embodiments of the inventive concepts, a data storage device self-detects an error in response to an operation command of a host. When an error is detected, the data storage device separately stores a log on the operation command. The data storage device stores relevant information at the time of failure in a predetermined or, alternatively, desired area, so that efficient failure analysis is accomplished.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of operating a data storage device which is provided with an operating voltage from a host and communicates with the host, the method comprising:

converting an operation mode of the data storage device into a debugging mode in response to a log start command transmitted from the host;
receiving a first operation command from the host;
executing the first operation command;
generating first log information corresponding to a result of executing the first operation command;
storing the first log information in a first storage area of memory of the data storage device;
determining whether an event occurred based on a result of performing a data processing operation corresponding to the first operation command, and a reference count as a reference of the data processing operation; and
copying at least part of the first log information from the first storage area to a second storage area of the memory of the data storage device when the event occurs.

2. The method of claim 1, wherein the event occurs when an error is detected in data stored in the data storage device according to the first operation command.

3. The method of claim 1, wherein the event occurs when a read count corresponding to the first operation command is equal to or greater than a reference read count.

4. The method of claim 1, wherein the event occurs when a read reclaim count corresponding to the first operation command is equal to or greater than a reference read reclaim count.

5. The method of claim 1, wherein the event occurs when a number of program/erase (P/E) cycles performed according to the first operation command is equal to or greater than a reference P/E cycle count.

6. The method of claim 1, wherein the event occurs when a number of reserved blocks updated according to the result of executing the first operation command in the data storage device is less than a reference reserved block count.

7. The method of claim 1, further comprising:
receiving a second operation command from the host after occurrence of the event;
executing the second operation command;
generating second log information corresponding to a result of executing the second operation command;
storing the second log information in the first storage area of the memory of the data storage device; and
storing at least part of the second log information in the second storage area of the memory of the data storage device.

8. The method of claim 1, wherein the first storage area and the second storage area are different memory blocks.

9. The method of claim 1, wherein the first operation command is a command selected from the group consisting of a program command, a read command, and an erase command.

10. A method of operating a data storage device comprising:
receiving, at the data storage device, a log start command from a host;
changing an operation mode of the data storage device from a first mode into a debugging mode, in response to the log start command; and
when the data storage device is in the debugging mode,
receiving a first operation command from the host,
executing the first operation command,
generating first log information associated with the first operation command,
storing the first log information in a first storage area,
determining whether a first event occurred based on a result of performing a data processing operation corresponding to the first operation command, and a reference count as a reference of the data processing operation, and
copying at least part of the first log information from the first storage area to a second storage area in response to determining the first event occurred, if the determining determines the first event occurred,
the first and second storage areas being storage areas of the data storage device.

11. The method of claim 10, wherein the determining determines the first event occurred when an error is detected in data stored in the data storage device according to the first operation command.

12. The method of claim 10, wherein the determining determines the first event occurred when a read count of the data storage device is equal to or greater than a reference read count.

13. The method of claim 10, wherein the determining determines the first event occurred when a read reclaim count of the data storage device is equal to or greater than a reference read reclaim count.

14. The method of claim 10, wherein the determining determines the first event occurred when a number of program/erase (P/E) cycles performed by the data storage device is equal to or greater than a reference P/E cycle count.

15. The method of claim 10, wherein the determining determines the first event occurred when a number of reserved blocks updated according to a result of executing the first operation command in the data storage device is less than a reference reserved block count.

16. A method of operating a data storage system including a host and a data storage device, the method comprising:
receiving, at the data storage device, a log start command from the host;
changing an operation mode of the data storage device from a first mode into a debugging mode, in response to the log start command; and
when the data storage device is in the debugging mode,
receiving a first operation command from the host,
executing the first operation command,
generating first log information associated with the first operation command,
storing the first log information in a first storage area,
determining whether a first event occurred based on a result of performing a data processing operation corresponding to the first operation command, and a reference count as a reference of the data processing operation, and
copying at least part of the first log information from the first storage area to a second storage area in response to determining the first event occurred, if the determining determines the first event occurred,
the first and second storage areas being storage areas of the data storage device.

17. The method of claim 16, wherein the determining determines the first event occurred when an error is detected in data stored in the data storage device according to the first operation command.

18. The method of claim 16, wherein the determining determines the first event occurred when a read count of the data storage device is equal to or greater than a reference read count.

19. The method of claim 16, wherein the determining determines the first event occurred when a read reclaim count of the data storage device is equal to or greater than a reference read reclaim count.

20. The method of claim 16, wherein the determining determines the first event occurred when a number of program/erase (P/E) cycles performed by the data storage device is equal to or greater than a reference P/E cycle count.

* * * * *